United States Patent
Warwick et al.

(10) Patent No.: US 9,793,226 B2
(45) Date of Patent: Oct. 17, 2017

(54) POWER SUPPLY TRANSIENT PERFORMANCE (POWER INTEGRITY) FOR A PROBE CARD ASSEMBLY IN AN INTEGRATED CIRCUIT TEST ENVIRONMENT

(71) Applicants: Thomas P. Warwick, Melbourne, FL (US); James V. Russell, New Hope, PA (US); Dhananjaya Turpuseema, Whitehouse Station, NJ (US)

(72) Inventors: Thomas P. Warwick, Melbourne, FL (US); James V. Russell, New Hope, PA (US); Dhananjaya Turpuseema, Whitehouse Station, NJ (US)

(73) Assignee: R & D Circuits, Inc., South Plainfield, NJ (US)

( * ) Notice: Subject to any disclaimer, the term of this patent is extended or adjusted under 35 U.S.C. 154(b) by 0 days.

(21) Appl. No.: 15/055,089

(22) Filed: Feb. 26, 2016

(65) Prior Publication Data
US 2017/0250146 A1 Aug. 31, 2017

(51) Int. Cl.
| H05K 1/00 | (2006.01) |
| H01L 23/66 | (2006.01) |
| H01L 23/64 | (2006.01) |
| G01R 1/073 | (2006.01) |
| G01R 31/28 | (2006.01) |

(52) U.S. Cl.
CPC .......... *H01L 23/66* (2013.01); *G01R 1/07342* (2013.01); *G01R 31/2851* (2013.01); *H01L 23/642* (2013.01)

(58) Field of Classification Search
CPC . H05K 1/00; H05K 3/00; H01L 23/66; H01L 23/642
USPC ........ 174/258, 261; 324/72.5, 750.2, 754.18, 324/756.03, 756.05, 762.02; 29/842, 846
See application file for complete search history.

(56) References Cited

U.S. PATENT DOCUMENTS

| 5,418,469 A * | 5/1995 | Turner ............... G01R 1/07328 324/72.5 |
| 5,974,662 A * | 11/1999 | Eldridge .............. B23K 20/004 174/261 |
| 2002/0067181 A1 * | 6/2002 | Eldridge .............. B23K 20/004 324/756.03 |
| 2003/0099097 A1 * | 5/2003 | Mok .................. G01R 1/06716 361/767 |
| 2010/0327897 A1 * | 12/2010 | Kazama ............. G01R 1/07378 324/756.03 |

(Continued)

*Primary Examiner* — Xiaoliang Chen
(74) *Attorney, Agent, or Firm* — Richard B. Klar; Law Firm of Richard B. Klar

(57) ABSTRACT

The present invention describes essentially three different embodiments for the implementation of low impedance (over frequency) power delivery to a die. Such low impedance to a high frequency allows the die to operate at package-level speed, thus reducing yield loss at the packaging level. Each embodiment addresses a slightly different aspect of the overall wafer probe application. In each embodiment, however, the critical improvement of this disclosure is the location of the passive components used for supply filtering/decoupling relative to prior art. All three embodiments require a method to embed the passive components in close proximity to the pitch translation substrate or physically in the pitch translation substrate.

18 Claims, 20 Drawing Sheets

(56) References Cited

U.S. PATENT DOCUMENTS

2011/0254577 A1* 10/2011 Kuo .................. G01R 31/2889
324/756.03
2013/0069683 A1* 3/2013 Kuo .................... G01R 1/0491
324/755.03

* cited by examiner

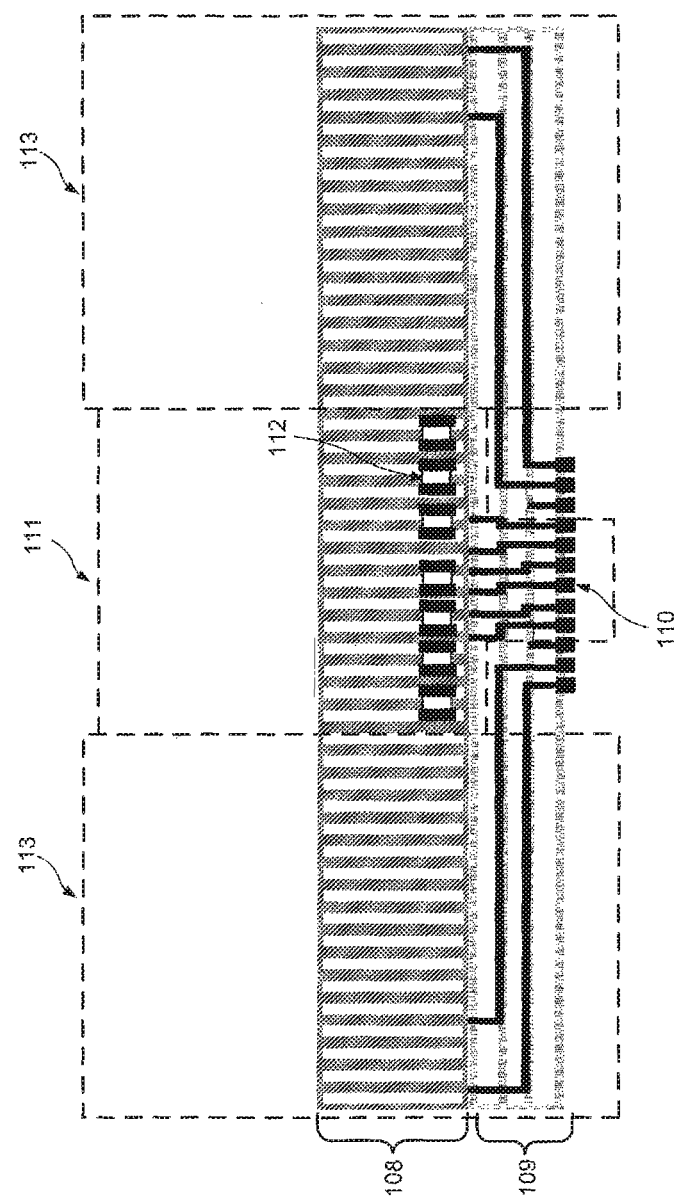

POWER SUPPLY TRANSIENT PERFORMANCE (POWER INTEGRITY) FOR A PROBE CARD ASSEMBLY IN AN INTEGRATED CIRCUIT TEST ENVIRONMENT

BACKGROUND

1. Field

This present invention is a structure for addressing power integrity issues associated with automating testing of very high speed integrates circuit devices in a singulated or unsingulated die (wafer) form. In particular the present invention provides a structure for an improved pitch translation substrate and for locating or embedding passive components closer to the pitch translation substrate.

2. Definitions

Certain terminology is defined below for a better understanding of the disclosure of the present invention.

Probe card: A multilayer printed circuit board, usually 3 mm to 8 mm thick. It is used as the electrical signal routing interface from the (automated) test system to the pitch translation substrate. The probe card itself translates pitch but on a much larger scale. The probe card also provides mechanical support to the pitch translation substrate and the probe housing. The probe card is described and shown in drawings for clarity.

Pitch Translation Substrate: The pitch translation substrate (PTS) provides an interface between the probe card and the probe housing assembly. Standard printed circuit board material does not allow pitches fine enough to support the electrical connect patterns on an integrated circuit die. The PTS uses special materials and is much smaller than the probe card, allowing the electrical signal routing to exist between the die and the probe card. Most PTS devices are commonly known by the material used to manufacture them.

These include, but are not limited to, "MLC" (multi-layer ceramic), "MLO" (multilayer organic), "Si Sub" (silicon substrate), "Glass sub" (glass substrate). The main focus of this disclosure is the PTS, as improved power integrity requires changes to this structure.

Probe Housing Assembly: The probe housing assembly includes the actual electrical probes between the integrate circuit die and the PTS. The probe housing is described and shown in drawings for clarity.

Die: The die references the actual electrical integrated circuit for which the entire probe assembly is designed to test. Typically die are manufactured in bulk on a silicon wafer; this document refers to this form as the "unsingulated" form. Unsingulated form is the most common form for die testing. Die may be tested individually in "singulated" form, where each die is physically separated from the wafer. Die may also be tested in a "reconstituted" wafer form, where by the die is placed at a different spacing than on the original wafer. The probe assembly, including the probe card, pitch translation substrate, and probe housing, is used in any one of these three forms for die test. The main purpose of addressing power integrity/impedance issues in this disclosure is to allow the die to be tested as close as possible to its mission mode (end user application) prior to packaging.

Wafer: The wafer—typically 200 mm, 300 mm, or 450 mm in diameter—is the base upon which each individual die is manufactured. One wafer may contain 30-40 to several 1000 individual die in their unsingulated form. The wafer is in diagrams for clarity. When shown, the reader should assume the test probes connect to an individual die on the wafer.

Chuck: The chuck is a large platen, usually made of metal, that supports and clamps the wafer/die during test. The chuck also is the moving mechanism, which increments from die to die so that each die may be tested. The chuck is shown in drawings for clarity.

Power Integrity: A description of how well the probe assembly can meet transient current demands placed on supply and ground pins when a device operates. A critical FIG. of merit for power integrity is "supply loop impedance" over frequency.

Supply Loop Impedance: This is a measure of how much voltage will drop across the supply and ground pins (power pins) of the probe assembly when the integrated circuit under test (die) places a sinusoidal or transient current demand on the power pins (Voltage Drop/Current in the frequency domain, F). The lower the supply loop impedance, the less the voltage drops. Loop impedance indicates that both the supply and ground pins have been included. In over-simplified terms, loop impedance is often described in the industry as "self inductance", where self inductance ($L_S$) is equal to ½ of the loop inductance ($L_L$) and $|j2\pi F\ L_L|$ is equal to the loop impedance associated with a simple inductance. "Loop impedance" is the more correct and general term as it accounts for non-ideal inductor occurrences in the supply-ground path such as resonance points.

Data Eye: Because supply loop impedance may not directly translate into improvements in performance, a data eye is also used as a visual FIG. of merit. The data eye overlays digital data in a data stream from the die under test using periodic time division, usually associated with an operating clock or embedded clock. An open center data eye indicates good operational margins, where as errors may occur as the eye center closes.

Compliant Electrical Interconnect: An electrical interconnect device that requires some level of compression to make electrical contact between desired pads on two different surfaces.

Compliant interconnects allow for higher levels of coplanar discrepancies between two surfaces, movement (i.e. thermal expansion relief) and usually, ease of interchangeability. Examples include, but are not limited to, spring contact probes, conductive elastomer sheets, and conductive elastomer pins.

Permanent Electrical Interconnect: An electrical interconnect device that makes a permanent bond and electrical contact between desired pads on two different surfaces. Permanent interconnects are characterized by lower contact resistance, high structural rigidity, and a far greater application of heat and force to de-bond the two surfaces. Examples include, but are not limited to solder and thermalsonically bonded copper pillars.

Redistributed Layer (RDL): An electrical routing layer that exists within the pitch translation substrate and serves the purpose of point to point connections from the very fine pitch of the die to the much large pitch of the probe card. In many cases there may be intermediate steps and multiple interconnecting redistribution layers.

3. The Related Art

FIG. 11 illustrates a sectional view of the related prior art and is provided for reference purposes only. In the prior art, a wafer probe or die probe setup involves the probe card [80], the attach mechanism [82] pitch translation substrate [81], the probes and probe head [83], and the wafer prober chuck (simply chuck) [85]. In operation, the chuck [85]

moves from die to die in an X-Y direction. When the next die to test has been reached the chuck [85] raises the wafer/die [84] into the probe head [83]. The probes [83] make mechanical contact to the die on the wafer [84] and thus provide a conductive electrical path, allowing the die [84] to be tested.

In the prior art passive electrical components [86] (generally capacitors) provide charge storage for transient current demands (charge/time) from the die [84] during its operation and while under electrical test. A common practice in the prior art uses the area directly above the die [84] on the pitch translation substrate [81] and the probe card [80] for routing.

The physical distance between the passive electrical components [86] and the die under test on the wafer [84] directly impacts how well the stored charged in the passive electrical components [86] can be delivered to meet the transient current demands of the die [84]. If the distance is longer, there will be more delay that will occur as a result of the length of the distance. Since a decoupling capacitor acts as RF short, this delay generally has an inductive effect up to ~1 Ghz, and then vacillates between higher impedance and a lower impedance as frequency increases (See FIG. 12B). This is a common distributed impedance affect. Due to the thickness of the probe card varying from application to application, the exact locations of the resonant points change. The net impact is shown in FIGS. 13B, 14B, 15B, and 16B. Based on the data eyes shown in FIGS. 13B and 14B, the die stops working properly between 667 MB/s and 1000 MB/s. FIG. 16B shows a 1 GHz clock. In this case ringing tends to align, but the edge transitions heavily distorted.

In somewhat over-simplified terms, the issue may be explained by simplifying the effective loop impedance to a loop inductance $L_L$. Voltage Drop is equal to the loop inductance multiplied by the derivative of the transient current demand relative to time. $\Delta V = L_L \times dI/dt$. When transistor on the die transition state a transient current is created and relates, in simplified terms, to the amount of parasitic capacitance $C_p$ and partially on/partially-off current the transistors must drive. As $L_L$ increases, the output response of the transistors has delayed, dampened sinusoidal ringing or a delayed reduced edge. In this simplified case, both possible responses relate to the dominant second order response of $L_L$ and $C_p$—often modeled as a second order differential equation. The ringing is most noticeable in FIG. 14B.

4.

Standard prior art technology uses a solder reflow process to attach passive components to the probe card. This attach method has the benefit of 30+ years of industry knowledge and implementation. Therefore it is low-cost and reliable—both come at the expense of performance. It would be desirable to provide a structure or structures that overcomes the aforementioned problems associated with the aforementioned prior art proposals.

SUMMARY

The present invention provides for a structure for an improved pitch translation substrate and for locating or embedding passive components closer to the pitch translation substrate. The present invention provides essentially three different embodiments of such a structure for the implementation of low impedance (over frequency) power delivery to a die. Such low impedance to a high frequency allows the die to operate at package-level speed, thus reducing yield loss at the packaging level. Each embodiment addresses a slightly different aspect of the overall wafer probe application. In each embodiment, however, the critical improvement of this disclosure is the location of the passive components used for supply filtering/decoupling relative to prior art. All three embodiments require a method to embed the passive components in either close proximity to the pitch translation substrate or physically within the pitch translation substrate.

The first embodiment of the present invention (See FIGS. 1-4.) embeds the decoupling components and planes in a interposer structure that also acts as an attach mechanism between the pitch translation substrate and the probe card. This embodiment has the benefit of inter-changeability, as the pitch translation substrate can be a wear item in high volume testing. While better than prior art, some performance degradation occurs relative to other embodiments. The first embodiment may work with any form of pitch translation substrate. However, the short electrical lengths of glass and silicon substrates give the greatest benefit.

The second embodiment (See FIGS. 5-7.) attaches the decoupling components directly to the upper surface pitch translation substrate. The substrate mounts to a protective mechanical housing that also provide electrical interconnects to the probe card. This embodiment has the benefit of greater power integrity and inter-changeability. However, the replacement mechanism is more expensive than the first embodiment. The second embodiment requires the short electrical lengths of glass and silicon substrates to achieve its benefits.

The third embodiment (See FIGS. 8-10.) fully embeds the decoupling components directly to the pitch translation substrate directly beneath thin electrical signal redistribution layers. This embodiment has the benefit of the greatest power integrity performance at the expense of inter-changeability. The entire assembly must be replaced when worn. The third embodiment may be built in any applicable material.

BRIEF DESCRIPTION OF DRAWINGS

FIGS. 1-4 basically describe a first embodiment of the present invention showing a structure which embeds the decoupling components and planes in a interposer structure that also acts as an attach mechanism between the pitch translation substrate and the probe card wherein:

FIG. 1 is partially exploded sectional view of a first embodiment of the present invention in which the present invention is shown as a structure which embeds the decoupling components and planes in a interposer structure that also acts as an attach mechanism between the pitch translation substrate and the probe card;

FIG. 2 is a fully assembled sectional view of the first embodiment of the present invention as shown in FIG. 1;

FIG. 3 is a similar embodiment of the present invention as shown in FIGS. 1 and 2 in which the pitch translation substrate is soldered to the interposer structure for the decoupling components and planes;

FIG. 4 is a similar embodiment of the present invention as shown in FIG. 3 except that the pitch translation substrate is soldered to the probe card;

FIGS. 5-7 illustrate basically a second embodiment of the present invention in which a structure is provided for decoupling components to directly attach to the upper surface pitch translation substrate in which:

FIG. 5 is partially exploded sectional view of a second embodiment of the present invention in which the present invention is shown as a structure for decoupling component to directly attach top the upper surface pitch translation substrate;

FIG. 6 is a fully assembled view of the second embodiment shown in FIG. 5;

FIG. 7 is a similar embodiment of the present invention as shown in FIGS. 5 and 6 except that the pitch translation substrate is soldered to the probe card;

FIGS. 8-10 illustrate basically a third embodiment of the present invention in which the decoupling components are fully embedded directly to the pitch translation substrate directly beneath thin electrical signal redistribution layers, in which;

FIG. 8 is partially exploded sectional view of a third embodiment of the present invention in which the present invention is shown as a structure in which the decoupling components are fully embedded directly to the pitch translation substrate directly beneath thin electrical signal redistribution layers, FIG. 9 is a fully assembled sectional view of the third embodiment shown in FIG. 8, FIG. 10 is a similar embodiment of the present invention as shown in FIGS. 8 and 9 except that the pitch translation substrate is soldered to the probe card;

FIG. 20 is an expanded view of the pitch translation substrate of FIG. 8;

DETAILED DESCRIPTION OF THE PREFERRED EMBODIMENTS

Figure 1:
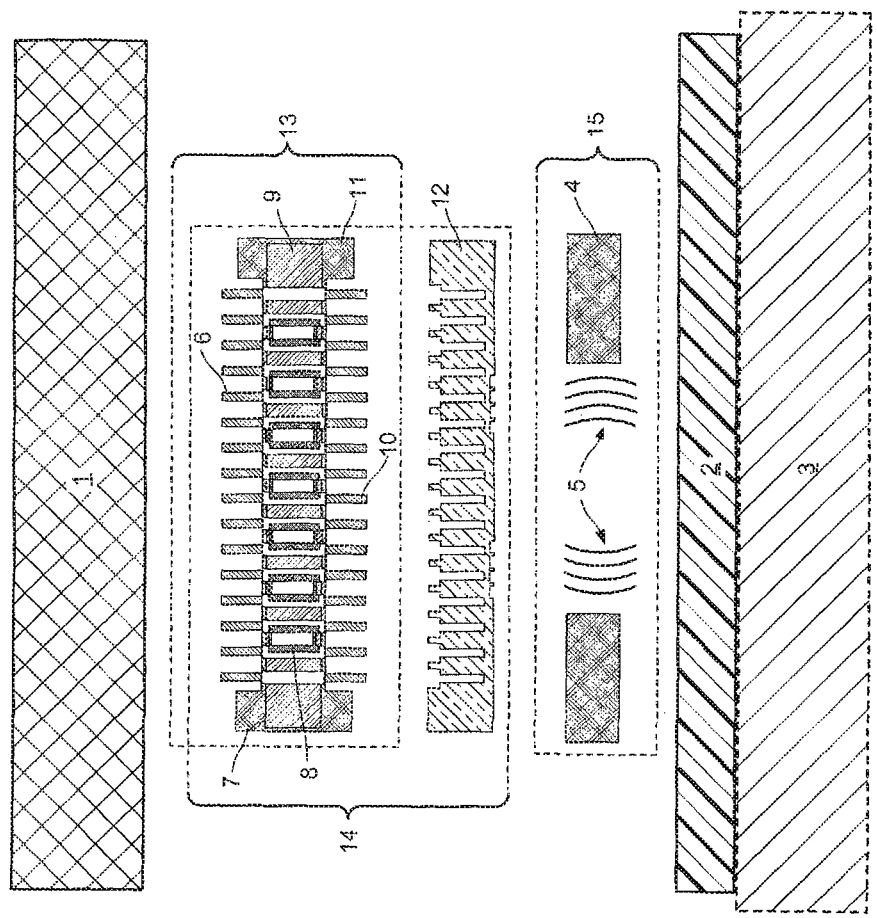

The element numbers of the various embodiments in the FIG.s of the drawings FIGS. 1-20, are as follows:

FIG. 1: Break-out Cross-sectional Diagram of First Embodiment with Compliant Interconnect
1. Probe Card Printed Circuit Board (PCB)
2. Wafer to be probed with individual die
3. Supporting probe Chuck
4. Probe housing
5. Probe mechanism
6. PCB to ECI Compliant Interconnect
7. Compression stop housing for #6
8. Embedded component, passive
9. Embedded Component Interposer (ECI) substrate
10. ECI to PTS Compliant Interconnect
11. Compression stop housing for #10
12. Pitch Translation Substrate (PTS) with through "glass" or "silicon" vias
13. Embedded Component Interposer Assembly, consisting of #6-#11
14. ECI/PTS Assembly, replacing prior art (e.g., MLO, MLC)
15. Probe Head Assembly FIG. 2: First embodiment (FIG. 1) Shown Assembled and Probing a Die
16. Probe Card Printed Circuit Board (PCB) (Same as FIG. 1.1)
17. Wafer to be probed with individual die (Same as FIG. 1.2)
18. Supporting probe Chuck (Same as FIG. 1.3)
19. ECI/PTS Assembly, replacing prior art (e.g. MLO, MLC) (Same as FIG. 1.14)
20. Probe Assembly (Same as FIG. 1.15)

Figure 3:
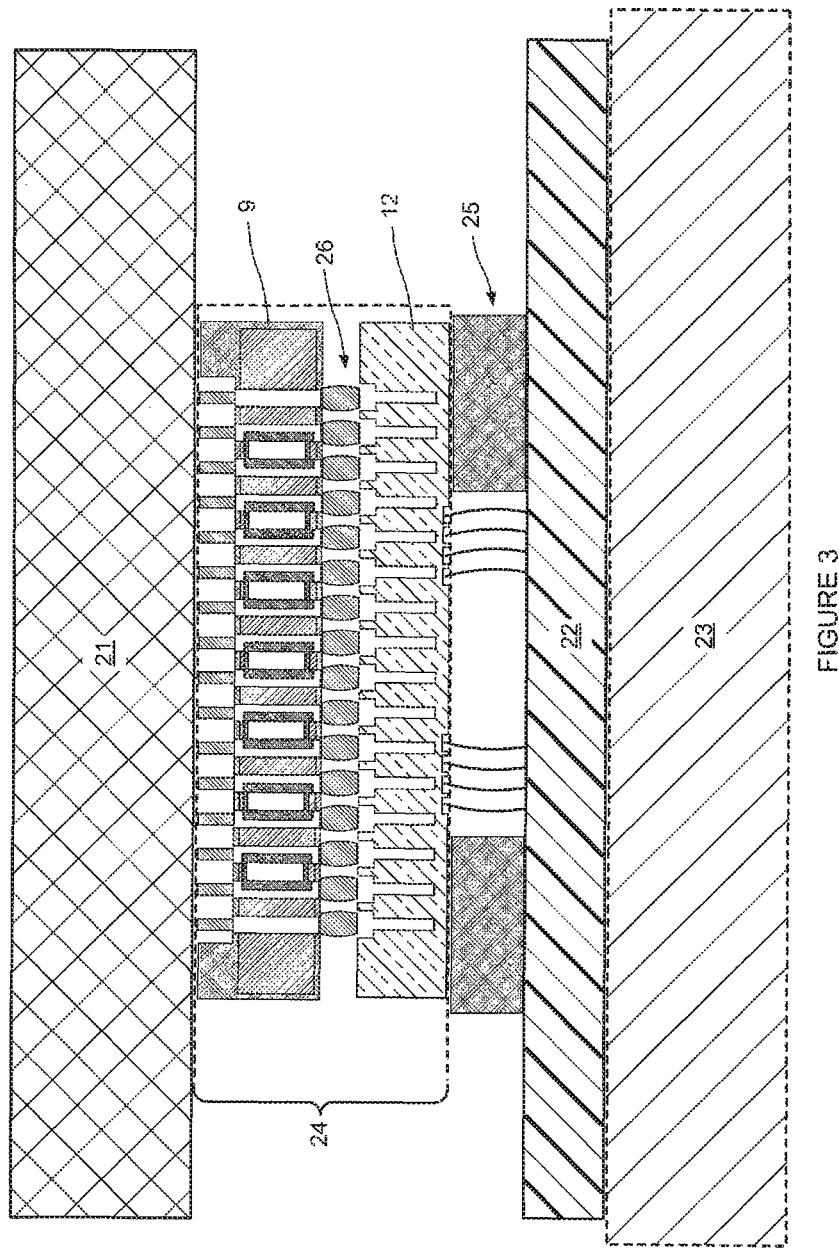
Figure 5:
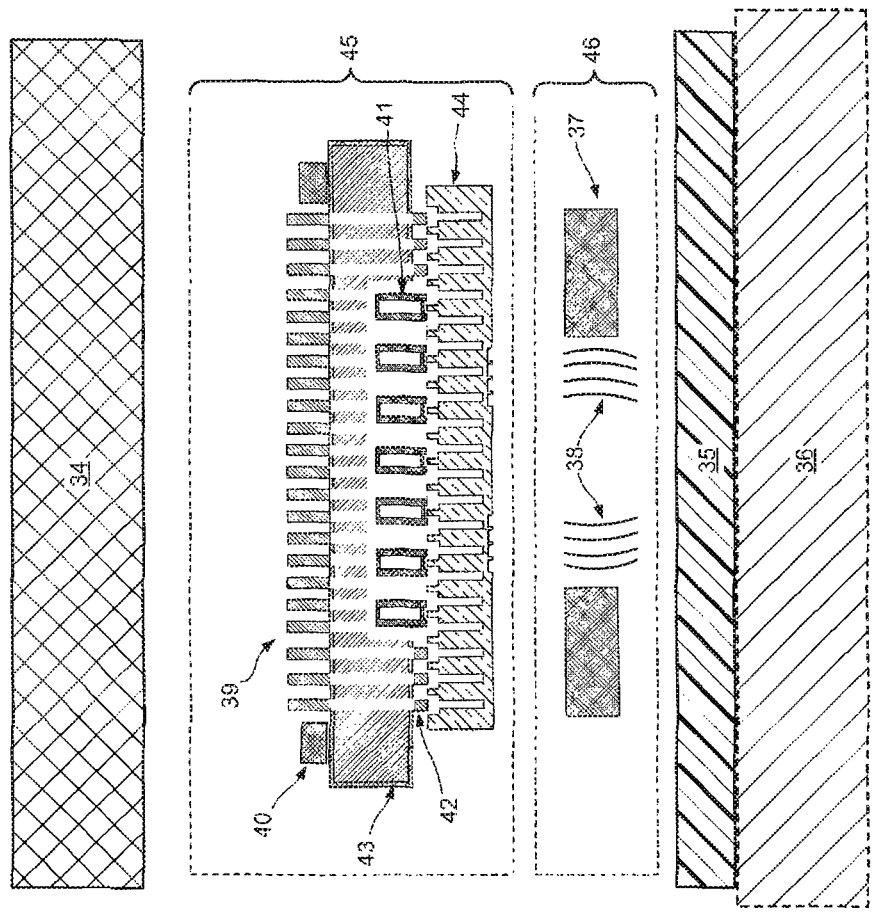
Figure 6:
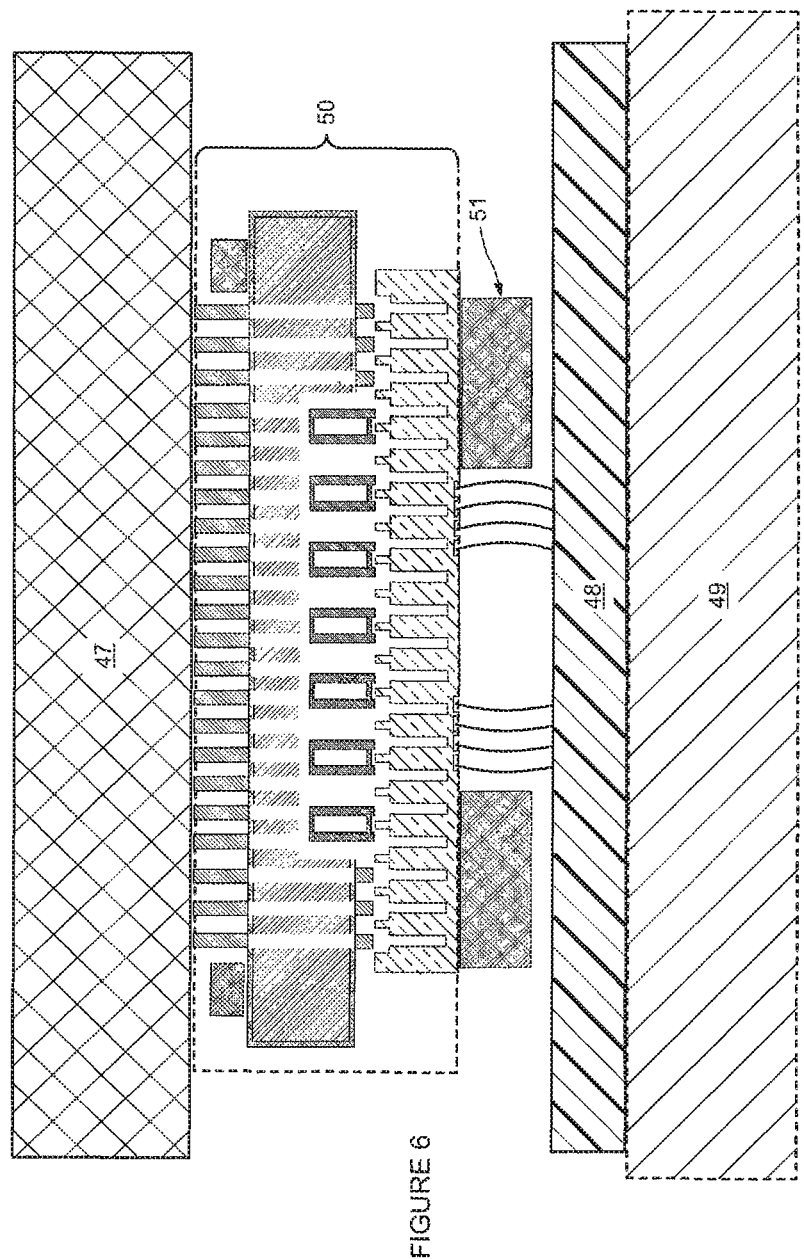
Figure 7:
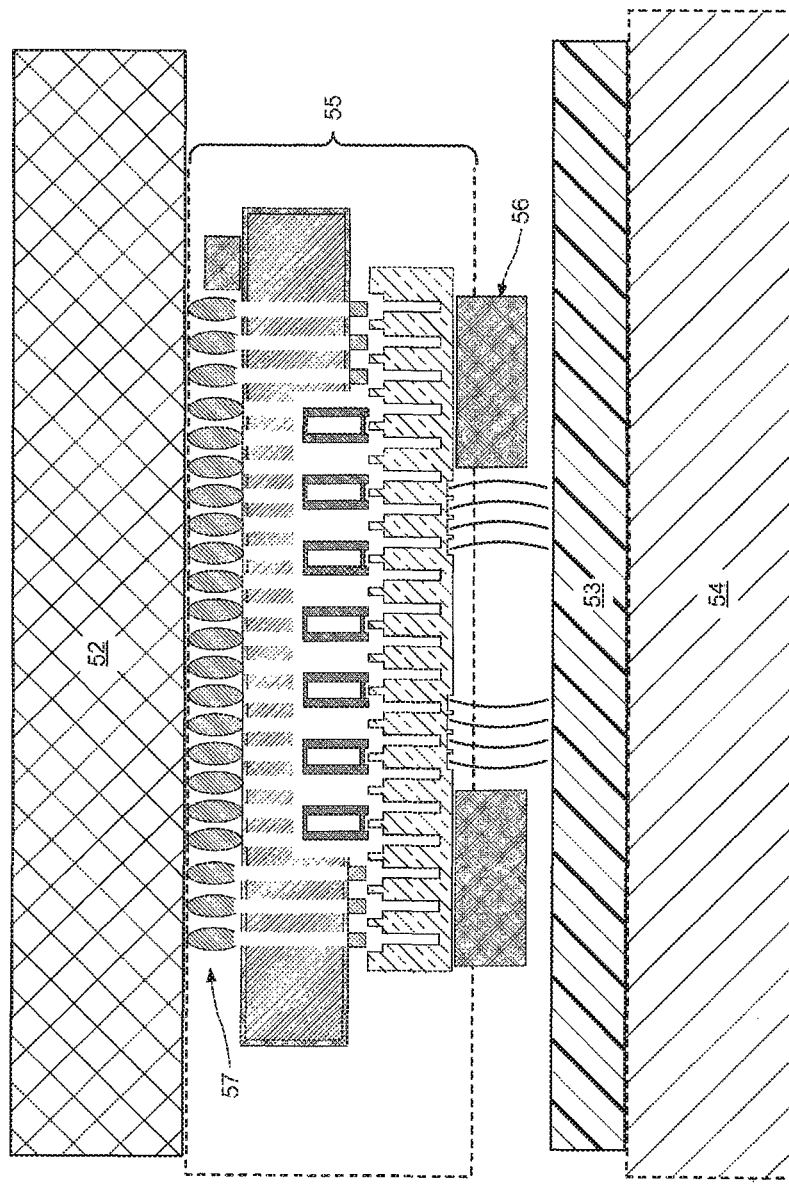

FIG. 3: Minor Deviation 1 to First Embodiment: Use of Permanent Electrical Interconnect Between PTS to the ECI
21. Probe Card Printed Circuit Board (PCB) (Same as FIG. 1.1)
22. Wafer to be probed with individual die (Same as FIG. 1.2)
23. Supporting probe Chuck (Same as FIG. 1.3)
24. ECI/PTS Assembly, replacing prior art (e.g., MLO, MLC) (Similar to FIG. 1.14, but items 10, 11 have been replaced with a permanent interconnect)
25. Probe Heat Assembly (Same as FIG. 1.15)
26. Permanent Conductive Interconnect Mechanism (Solder, Copper pillar) between ECI and the PTS FIG. 4: Minor Deviation 2 to First embodiment: Use of Permanent Electrical Interconnect between the PTS ECI Assembly and the Probe Card
27. Probe Card Printed Circuit Board (PCB) (Same as FIG. 1.1)
28. Wafer to be probed with individual die (Same as FIG. 1.2)
29. Supporting probe Chuck (Same as FIG. 1.3)
30. ECI/PTS Assembly, replacing prior art (e.g. MLO, MLC) (Similar to FIG. 1.14, but items 6.7 and 10, 11 have been replaced with a permanent interconnect)
31. Probe Head Assembly (Same as FIG. 1.15)
32. Permanent Conductive Interconnect Mechanism (Solder, Copper pillar) between the ECI and the PTS
33. Permanent Conductive Interconnect Mechanism (Solder, Copper pillar) between the ECI/PTS assembly and the probe card FIGS. for Second embodiment:
FIGS. 5-7 describe two minor deviations using cross-sectional views of the improved method for signal loading and power supply delivery using the second major embodiment: a glass or silicon based pitch translator substrate (PTS), based on a "TSV", "TGV", or like technology with passive components mounted directly onto the pitch translator. The components may be in either a die or packaged form. A stiffening element with electrical conductivity paths permanently attached to the pitch translator substrate for mechanical strengthening, better durability, and coarse pitch transition, as required. FIG. 5 describes the individual component pieces. FIG. 6 shows FIG. 5 assembled in "mission mode". FIG. 7 describe a minor deviation, where by the compliant interconnect has been replaced by a more permanent connection of any form but commonly solder and copper pillar.

In FIG. 5, labels 34-38, 46 describe necessary functional items associated with the disclosure but specifically included in the disclosure. These items are shown because they are necessary to describe both function and improvements over prior art.

FIG. 5: Cross-sectional Breakout Diagram for Embodiment #2: Embedded Decoupling Components Attached to the PTS with a Supporting Stiffener and using Compliant Electrical Interconnect
- 34. Probe Card Printed Circuit Board (PCB)
- 35. Wafer to be probed with individual die
- 36. Supporting probe Chuck
- 37. Probe housing
- 38. Probe mechanism
- 39. PCB to PTS Compliant Interconnect
- 40. Compression stop housing for #39
- 41. Embedded component, passive, and cavity
- 42. Permanent conductive attach mechanism between the PTS and the stiffening element
- 43. Stiffening Element with conductive paths for coarse pitch translation
- 44. Pitch Translation Substrate (PTS) with through "glass" or "silicon" vias or like technology
- 45. Embedded Component Pitch Translator Assembly, consisting of #39-#44
- 46. Probe Head Assembly FIG. 6: Second Embodiment (FIG. 5) Shown Assembled and Probing a Die
- 47. Probe Card Printed Circuit Board (PCB) (Same as FIG. 5.34)
- 48. Wafer to be probed with individual die (Same as FIG. 5.35)
- 49. Supporting probe Chuck (Same as FIG. 5.36)
- 50. ECI/PTS Assembly, replacing prior art (e.g. MLO, MLC) (Same as FIG. 5.45)
- 51. Probe Head Assembly (Same as FIG. 5.46)

FIG. 7: Minor Deviation for Second embodiment: Use of Permanent Electrical Interconnects between the adjoining stiffener to the probe card
- 52. Probe Card Printed Circuit Board (PCB) (Same as FIG. 5.34)
- 53. Wafer to be probed with individual die (Same as FIG. 5.35)
- 54. Supporting probe Chuck (Same as FIG. 5.36)
- ECI/PTS Assembly, replacing prior art (e.g. MLO, MLC) (Similar to FIG. 5.45, except that compliant elements #39 and #40 have been replaced with a permanent attach mechanism)
- 56. Probe Head Assembly (Same as FIG. 5.46)
- 57. Permanent attach mechanism between the embedded component/pitch translator substrate assembly and the probe card.

Figure 8:
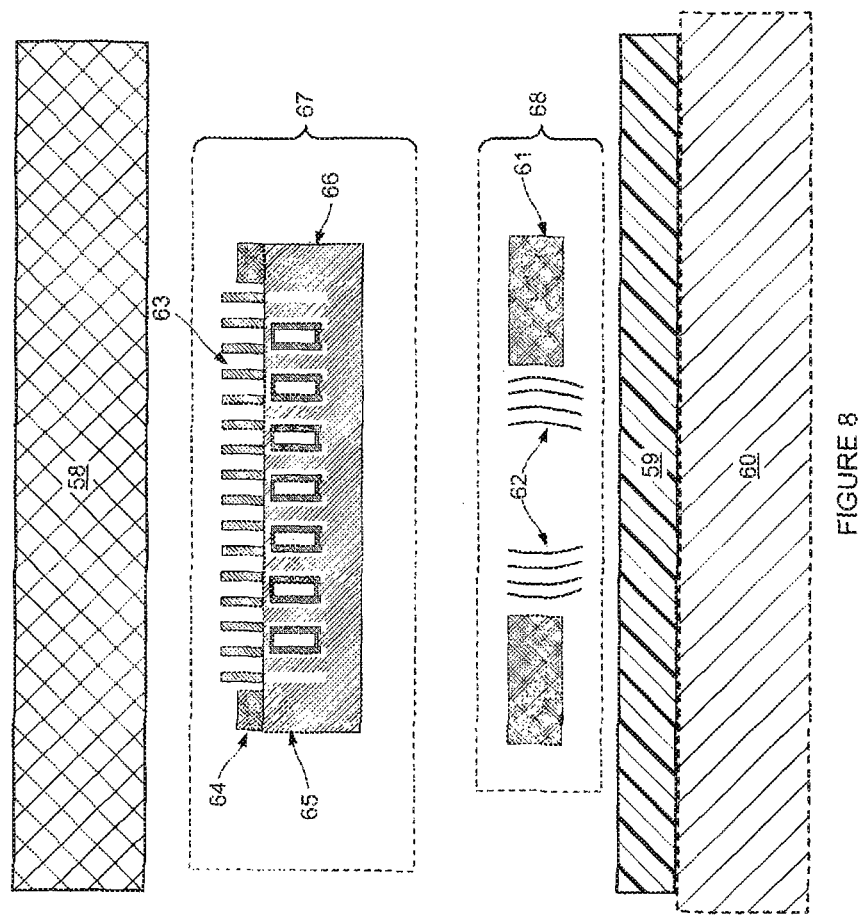
Figure 9:
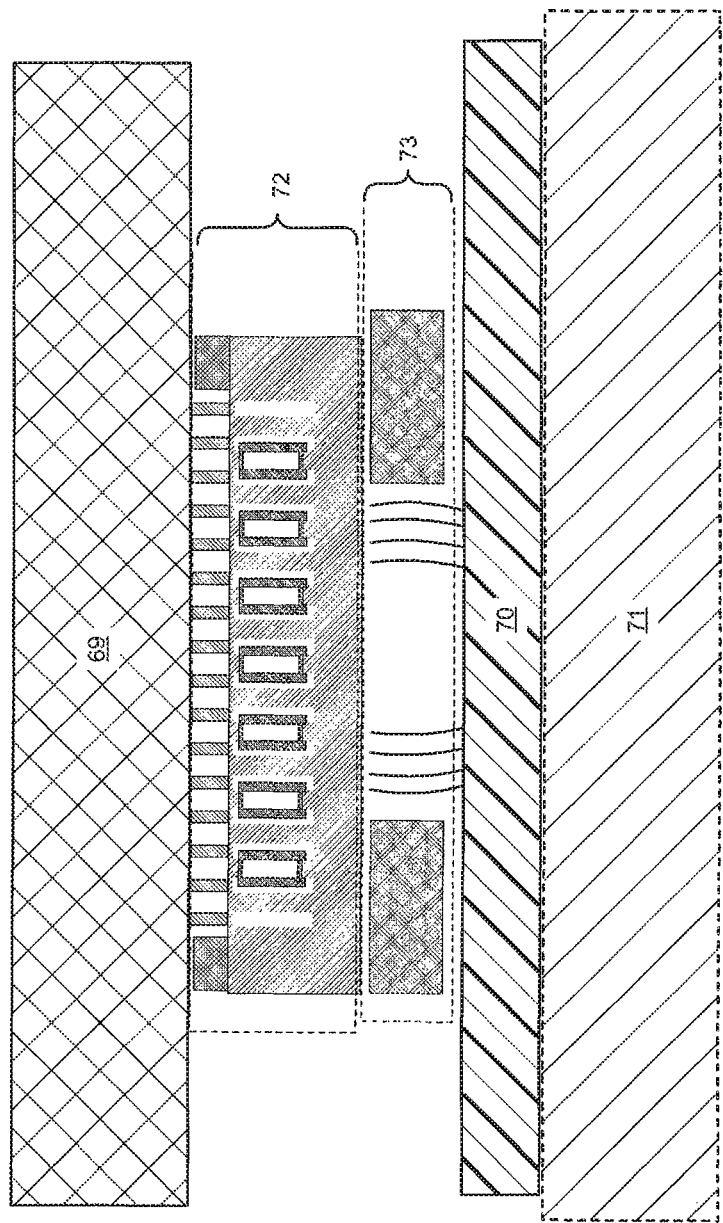
Figure 10:
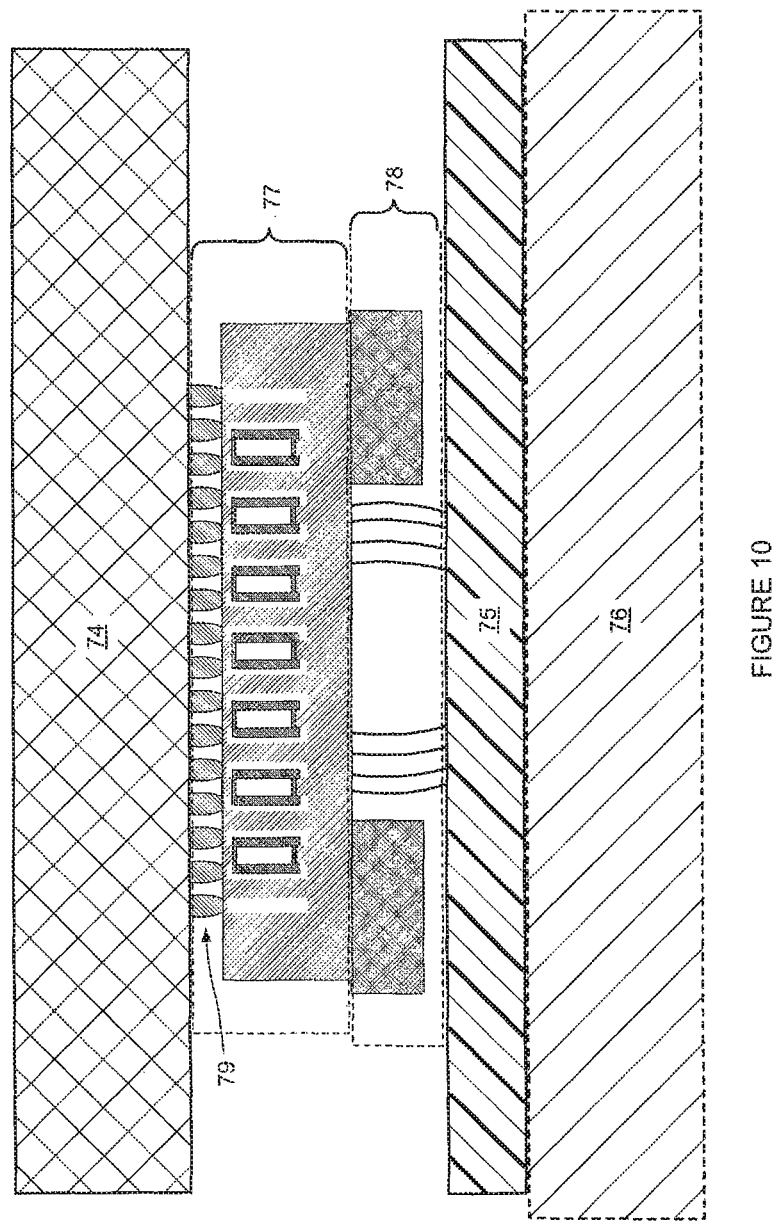

FIGS. For Third Embodiment:

FIGS. 8-10 describe two minor deviations using cross-sectional views of the improved method for signal loading and power supply delivery using the third major embodiment: a pitch translation substrate with passive electrical component embedded directly above the test die of interest. FIG. 8 describes the individual component pieces. FIG. 9 shows FIG. 8 assembled in "mission mode". FIG. 10 describe a minor deviation, where by the compliant interconnect has been replaced by a more permanent connection of any form but commonly solder and copper pillar.

FIG. 8, labels 58-62, 68 describe necessary functional items associated with the disclosure but specifically included in the disclosure. These items are shown because they are necessary to describe both function and improvements over prior art.

FIG. 8: Sectional Breakout Drawing for Third Embodiment: Passive Components Embedded directly into the Pitch translation Substrate using Compliant Electrical Interconnects
- 58. Probe Card Printed Circuit Board (PCB)
- 59. Wafer to be probed with individual die
- 60. Supporting probe Chuck
- 61. Probe housing
- 62. Probe mechanism
- 63. PCB to PCI Compliant Interconnect
- 64. Compression stop housing for #63
- 65. Embedded component, passive
- 66. Pitch Translation Substrate (PTS) with integrated Embedded Components
- 67. PTS Assembly
- 68. Probe head Assembly FIG. 9: Third Embodiment Shown Assembled (FIG. 8) and Probing a Die
- 69. Probe Card Printed Circuit Board (PCB) (Same as FIG. 8.58)
- 70. Wafer to be probed with individual die (Same as FIG. 8.59)
- 71. Supporting probe Chuck (Same as 8.60)
- 72. Pitch Translation Substrate (Same as FIG. 8.67)
- 73. Probe Housing (Same as 8.68)

FIG. 10: Minor Deviation to Third Embodiment: Use of Permanent Electrical Interconnects between the PTS and the probe card
- 74. Probe Card Printed Circuit Board (PCB) (Same as FIG. 8.58)
- 75. Wafer to be probed with individual die (Same FIG. 8.59)
- 76. Supporting probe Chuck (Same as FIG. 8.60)
- 77. Pitch Translation Substrate (Similar to FIG. 8.67 but modified for a permanent attach)
- 78. Probe Housing (Same as FIG. 8.68)
- 79. Permanent Attach Mechanism FIG. 11: Prior Art Description
- 80. Probe Card Printed Circuit Board (PCB)
- 81. Pitch Translation Substrate
- 82. Permanent Attach mechanism
- 83. Probe Housing and probes
- 84. Wafer be probed with individual die
- 85. Supporting probe Chuck
- 86. Solder Mount Passive Components FIGS. 12-16 shows performance comparisons between prior art and the disclosed embodiments. In FIGS. 12-16, the "A" side shows the improved performance of the disclosure; the "B" side show the performance of prior art.

Figure 12:
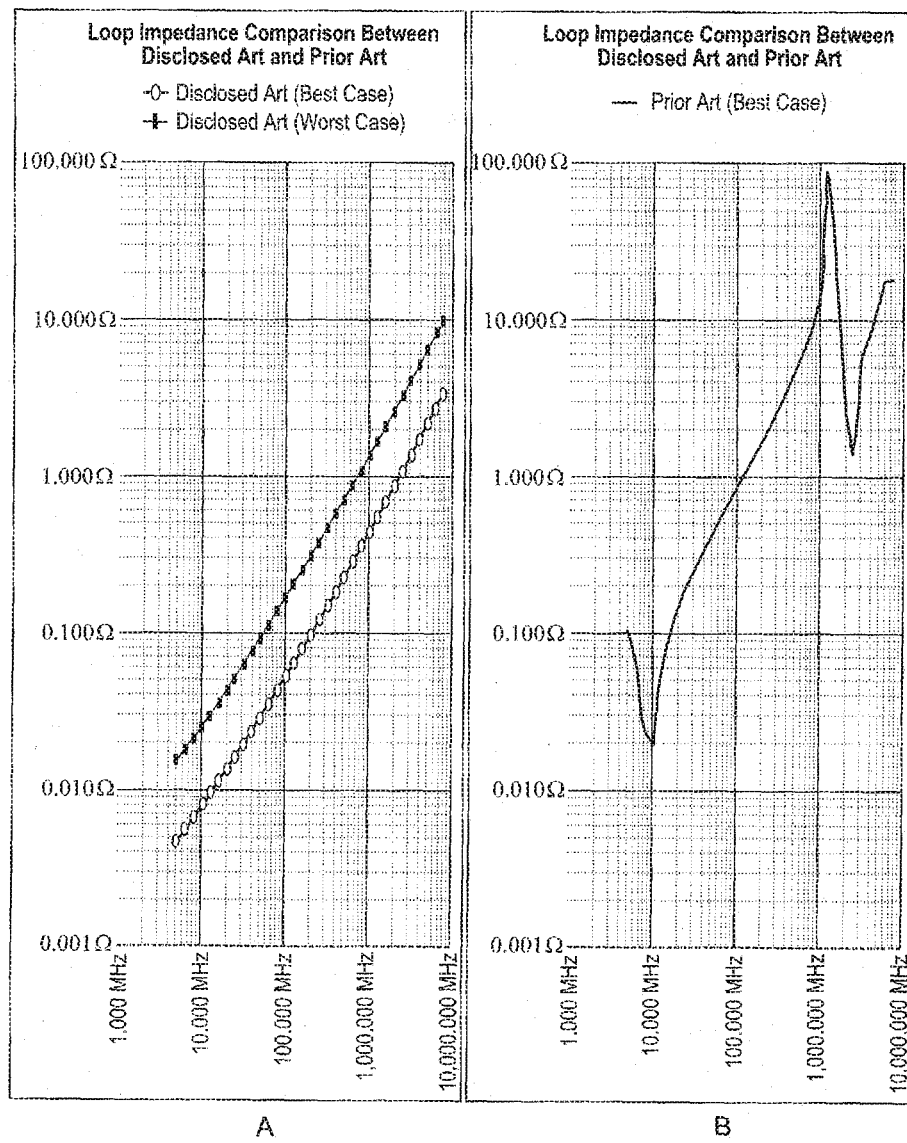
FIG. 12 is a graph showing a supply loop impedance in frequency domain for the first embodiment (FIGS. 1-4) and the third embodiment (FIGS. 8-10) compared with the prior art structure of FIG. 11.

FIG. 12: The supply loop impedance in frequency domain for First Embodiment (A) and Third Embodiment (A) Compared to Prior Art (B).

Figure 13:
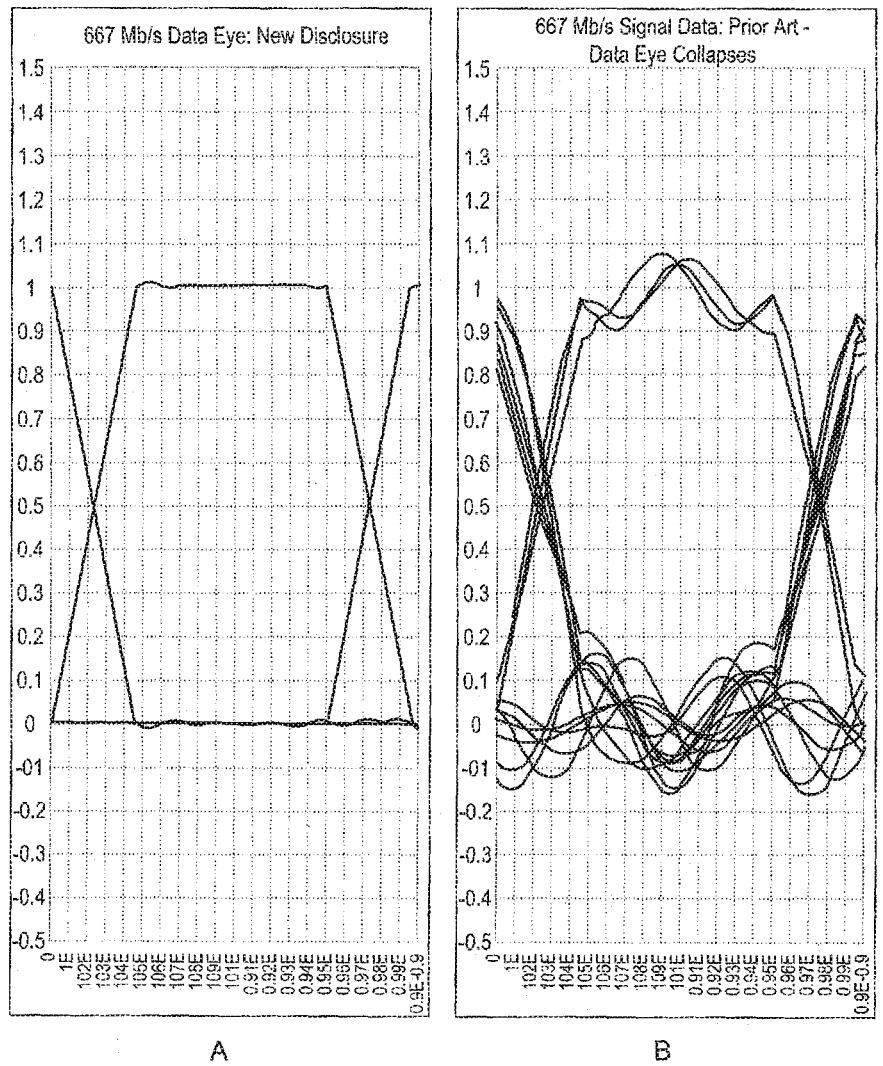
FIG. 13 is an illustration of a simple pattern data eye @ 667 Mb/S for the third embodiment FIGS. 8-10; A) compared to the prior Art (FIG. 11; B)

FIG. 13: A simple pattern data eye @ 667 Mb/s; Third Embodiment (A) Compared to Prior Art (B)

Figure 14:
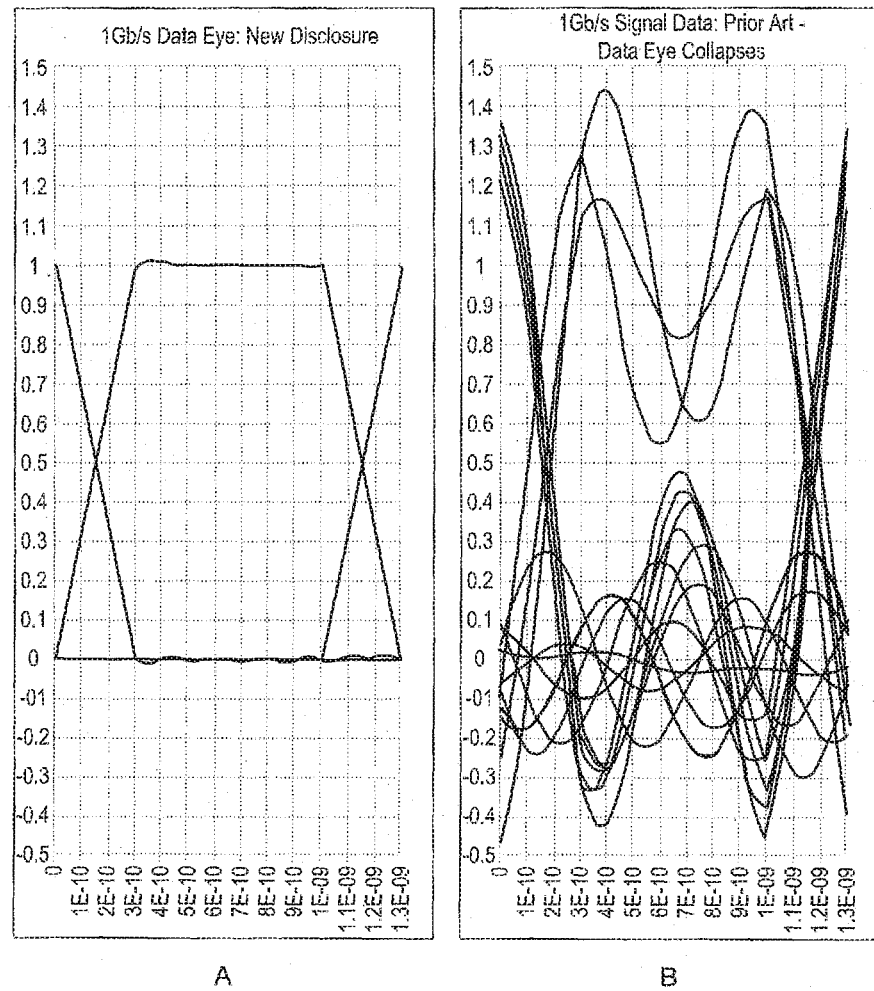
FIG. 14: is an illustration of a simple pattern data eye @ 1 Gb/s of the third Embodiment (A) (FIGS. 8-10) Compared to Prior Art (B) (FIG. 11)

FIG. 14: A simple pattern data eye @ 1 Gb/s: Third Embodiment (A) Compared to Prior Art (B)

Figure 15:
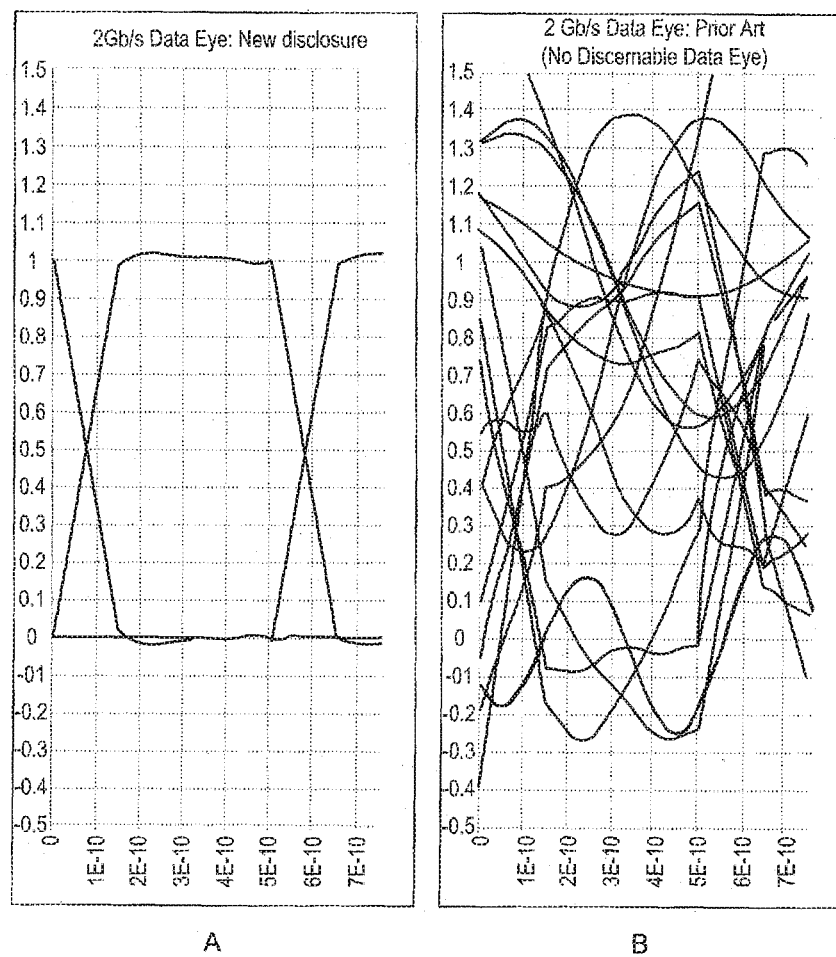
FIG. 15 is an illustration of a simple pattern data eye @ 2 GB/s Third embodiment (A) (FIGS. 8-10) compared to Prior Art (B) (FIG. 11)

FIG. 15: A simple pattern data eye @ 2 Gb/s; Third Embodiment (A) Compared to Prior Art (B)

Figure 16:
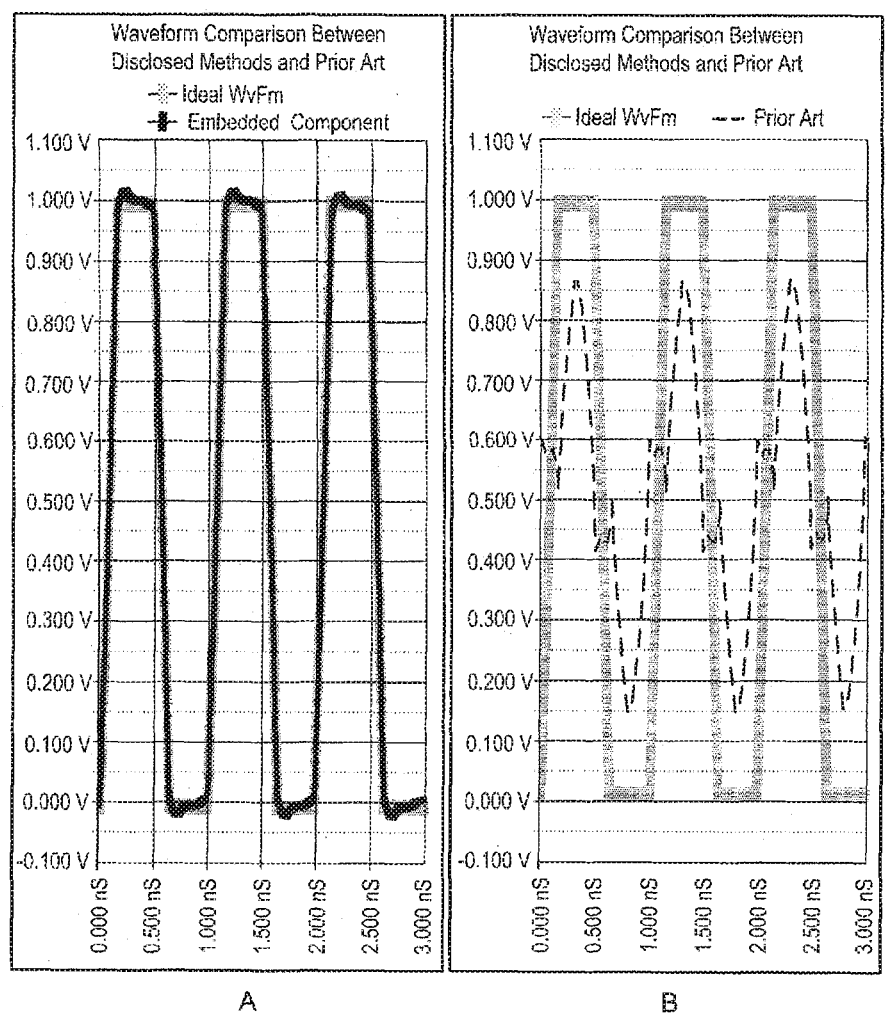
FIG. 16: illustrates Voltage vs. time domain clock pattern for Third embodiment(A) (FIGS. 8-10) compared to Prior Art (B) (FIG. 11)

FIG. 16: Voltage vs. time domain clock pattern for Third Embodiment (A) Compared to Prior Art (B).

Figure 17:
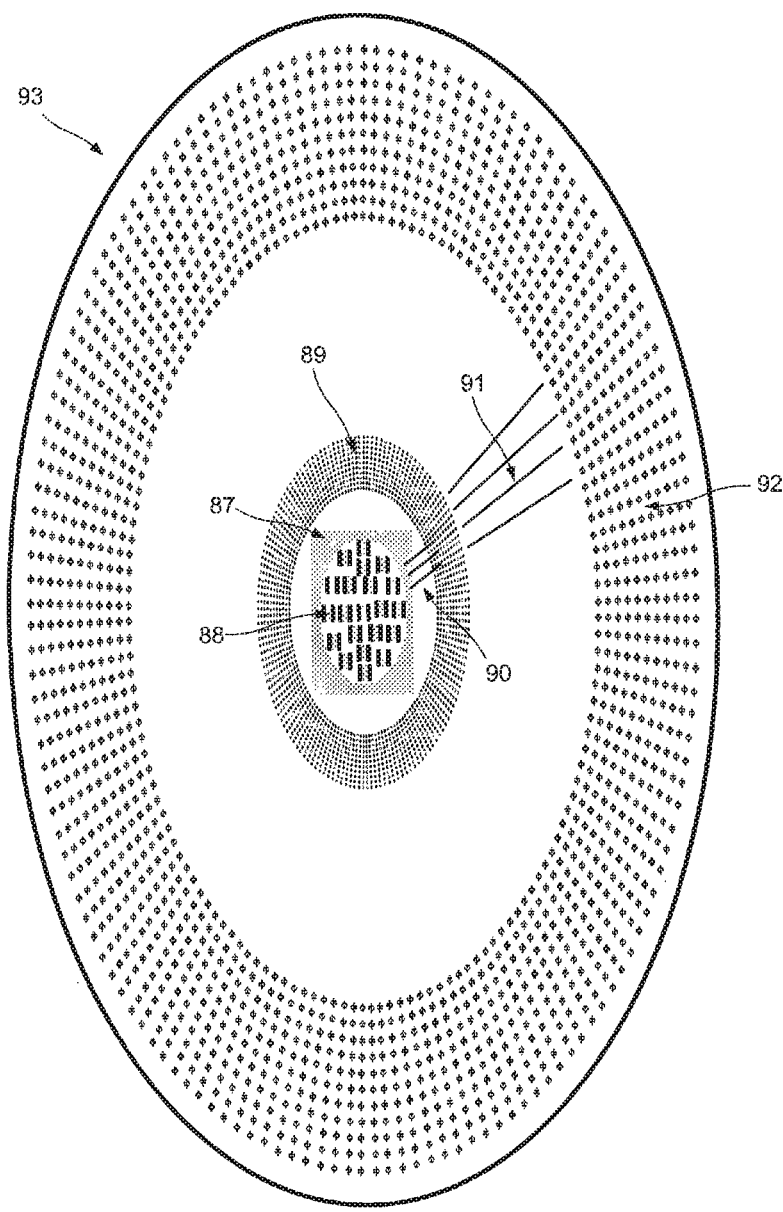
FIG. 17: is a top View showing Routing for Signals Relative to Capacitor Location on the Pitch Translation Substrate and/or the embedded component Interposer for all the embodiments of the present invention.
Figure 18:
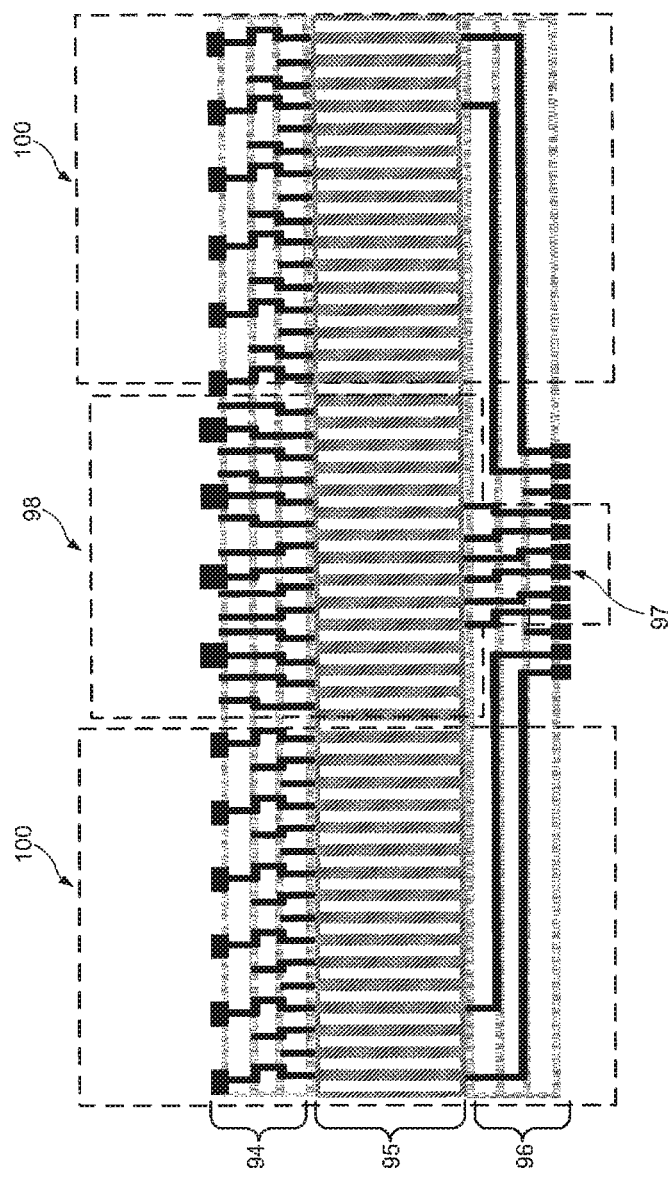
FIG. 18 is an expanded view of the pitch translation substrate of FIG. 1.

FIG. 17: Top-Down View Showing Routing for Signals Relative to Capacitor Location on the Pitch Translation Substrate and/or the embedded component Interposer 87. Location of the Die beneath the Pitch Translation Substrate (PTS)
88. Location of the Passive Components (e.g. decoupling capacitors) directly above the die in the ECI (Embodiment #1) or (PTS)
89. Fine pitch via ring: 50 um to 100 um pitch vias, commonly known "through silicon vias" (TSV) or "through glass vias" (TGV)
90. Signal Routing from the Die to the fine pitch via ring [89] on redistribution layers closest to die [87]
91. Signal Routing from the tine pitch via ring [89] to the interface pads [92] on redistribution layers opposite the die
92. Interface pads to the probed card through a permanent or complaint interconnect
93. Pitch translation Substrate FIG. 18: Cut Away View of the Modified Pitch Translation Substrate for Embodiment #1

94. Upper redistribution layers (opposite of die) for fan-out from the TSV/TGV to the interface pad to the ECI and probe card
95. Though via section of the pitch translation substrate
96. Lower redistribution layers (closest to the die) for fan-out from the die pads to the TSV/TGV
97. Die pads for interface the probes
98. "Keep-out" region for signal routing. This area in both redistribution regions and the TSV/TGV region is dedicated to supply and ground routing as much as possible.
99. Embedded component interposer (See FIG. 1), shown here to communicate that the embedded components are not integrated into the pitch translation substrate
100. Routing regions for signals. These regions are outside of the die area to allow room for the passive component routing directly above the die.

Figure 19:
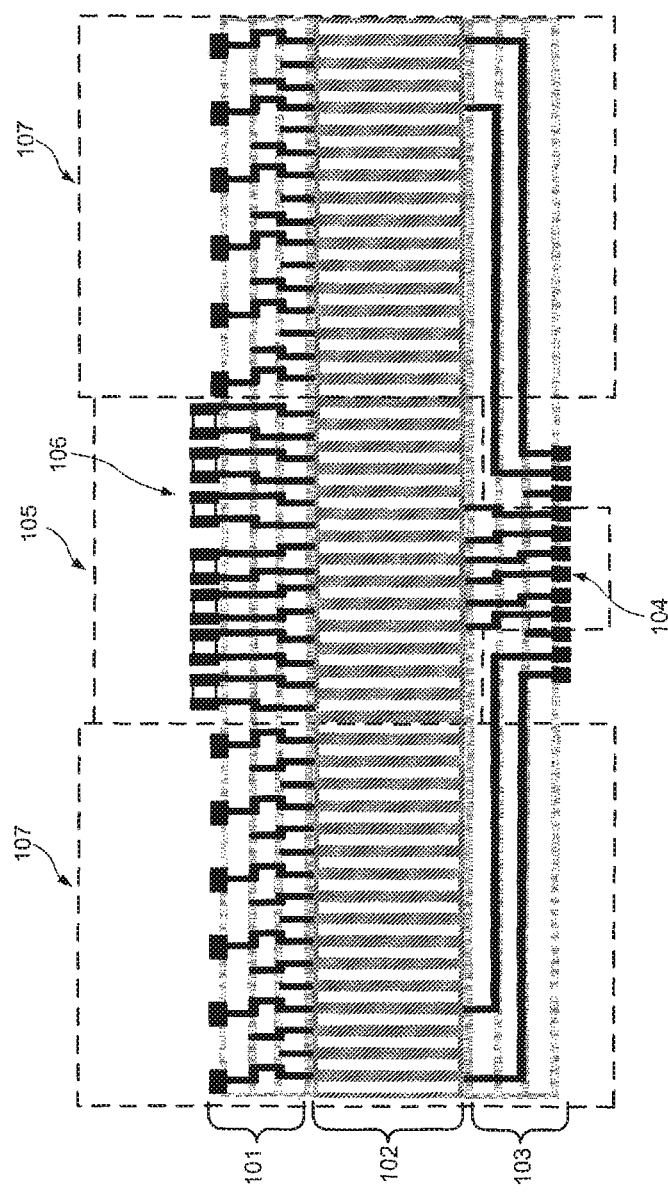
FIG. 19 is an expanded view of the pitch translation substrate of FIG. 5.

FIG. 19: Cut Away View of the Modified Pitch Translation Substrate for Embodiment #2

101. Upper redistribution layers (opposite of die) for fan-out from the TSV/TGV to the interface pad to the ECI and probe card
102. Though via section of the: pitch translation substrate
103. Lower redistribution layers (closest to the die) for fan-out from the die pads to the TSV/TGV
104. Die pads for interface the probes
105. "Keep-out" region for signal routing. This area in both redistribution regions and the TSV/TCV region is dedicated to supply and ground routing as much as possible.
106. Embedded components mourned on the pitch translation substrate (See FIG. 5).
107. Routing regions for signals. These regions are outside of the die area to allow room for the passive component routing directly above the die.

FIG. 20: Cut Away View of the Modified Pitch Translation Substrate for Embodiment #3

108. Though via section of the pitch translation substrate
109. Lower redistribution layers (closest to the die) for fan-out from the die pads to the TSV/TSV
110. Die pads too interface the probes
111. "Keep-out" region for signal routing. This area in both redistribution regions and the TSV/TGV region is dedicated to supply and ground routing as much as possible.
112. Embedded components mounted on the pitch translation substrate (See FIG. 5).
113. Routing regions for signals. These regions are outside of the die area to allow room for the passive component routing directly above the die.

The present invention provides for basically three embodiments with some variations or modifications for an improved pitch translation substrate and for locating or embedding passive components closer to the pitch translation substrate. Each embodiment addresses a slightly different aspect of the overall wafer probe application. For each embodiment, however, the critical improvement of this disclosure is the location of the passive components used for supply filtering/decoupling relative to the prior art. All three basic embodiments of the present invention require embedding the passive components in either close proximity to the pitch translation substrate or physically within the pitch translation substrate. In this way the present invention provides a structure whereon passive electrical components, such as discrete capacitors, can be placed significantly closer to a die under test by embedding and thus shortening the physical distance between the passive components and the die under test. The present invention provides various embodiments for implementing such embedded structures and methodology.

Referring to the drawings of FIGS. 1-20, FIGS. 1-4 describes basically a first embodiment of the present invention in which the decoupling components and planes are embedded in a interposer structure that also acts as an attach mechanism between the pitch translation substrate and the probe card. This first embodiment has the benefit of interchangeability, as the pitch translation substrate can be a wear item in high volume testing. While better than prior art, some performance degradation occurs relative to other embodiments. This first embodiment may work with any form of pitch translation substrate. However, the short electrical lengths of glass and silicon substrates give the greatest benefit.

Figure 2:
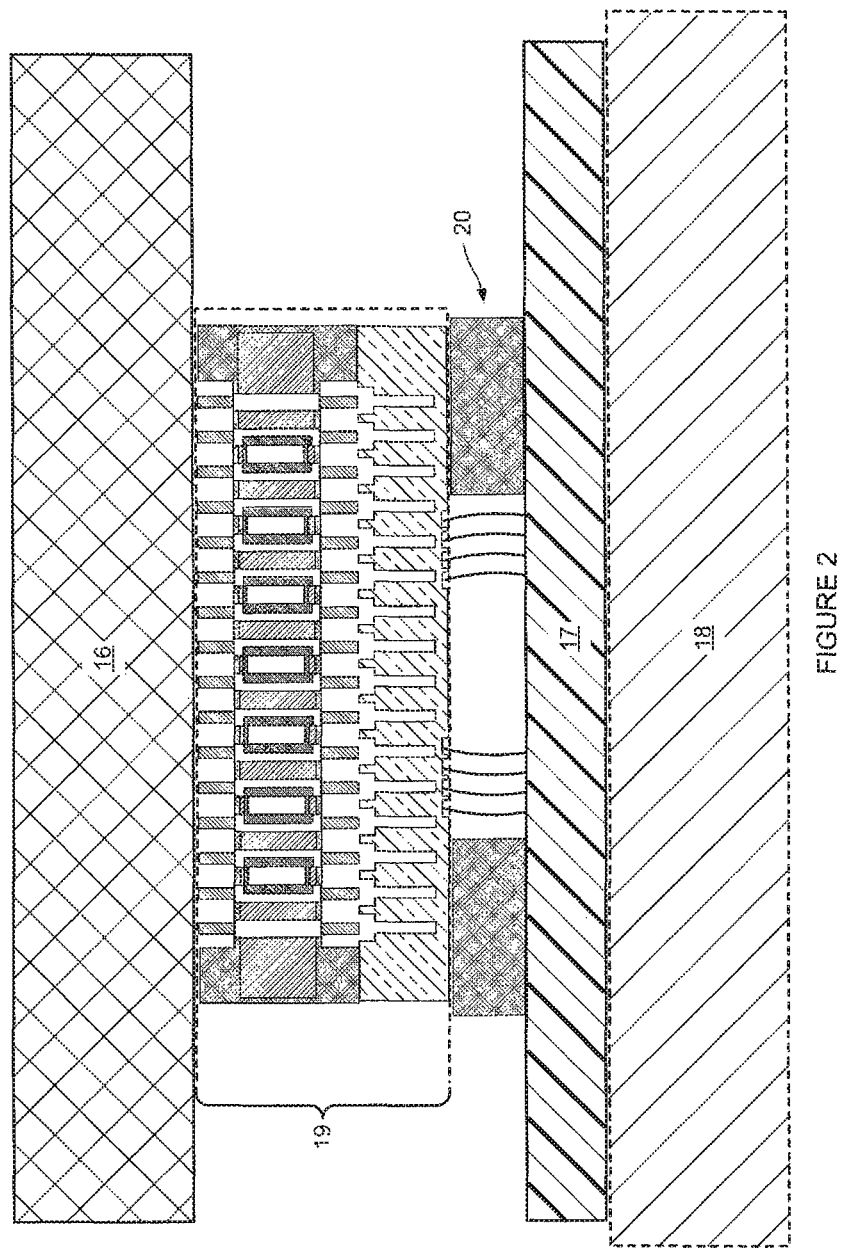
Figure 4:
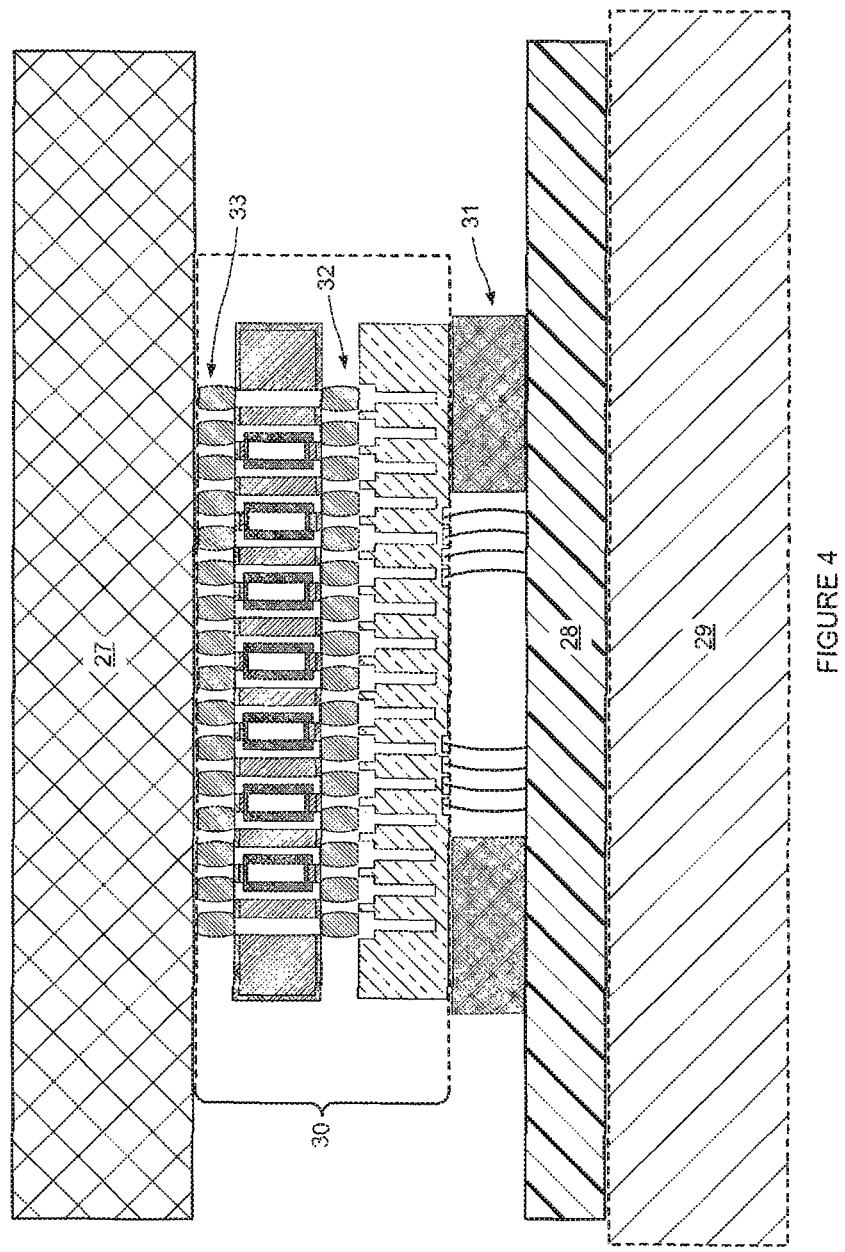

FIGS. 1-4 basically describe a first embodiment of the present invention with three minor deviations using sectional views of the improved method for signal loading and power supply delivery using the first major implementation: a discrete interposer with embedded components (passive) attached to a glass or silicon based pitch translator substrate, based on a "TSV", "TGV" or like technology. (TSV=through silicon via, TGV=through glass via). FIG. 1 describes the individual component pieces. FIG. 2 shows FIG. 1 assembled "mission mode". FIGS. 3 and 4 describe a minor deviation, whereby the compliant interconnect has been replaced by a more permanent connection of any form but commonly solder and copper pillar. In the embodiment of FIG. 1 there are two essential differences over the prior art of FIG. 11. First instead of the traditional pitch translation substrate of FIG. 11, the embodiment of FIG. 1 has a new pitch translation substrate 12 much thinner in width than the prior art substrate of FIG. 11. The new thinner substrate 12 if FIG. 1 is 50 to 100 micrometers thick compared to the 1 to 2 millimeters in thickness of the prior art substrate of FIG. 11

Second in the embodiment of FIG. 1 the capacitance 8 or passive components 8 are located in an interposer 9. Thus because of the thinner substrate 12 and the location of the capacitance or passive elements 8 on the interposer 9 the capacitance 8 are much closer to the probe card than the prior art structure of FIG. 11 and are 200-300 micro meters distance from the probe card compared with of 44 mm or 45 mm to 9 mm distance of the prior art structure of FIG. 11. Thus the structure of this first embodiment improves power supply filtering and decoupling, such that the die under test may operate at faster speeds, including package-level speeds. This structure has an extremely thin pitch translation substrate connects to passive decoupling components and reduces electrical length/delay in the supply path. In this structure the fan-out routing of the signals extends to the periphery of the pitch translation substrate for the purposes of prioritizing on power and ground routing directly above the die. Further in this structure the supply loop impedance is reduced such that the die may operate at faster speeds including package-level speeds. This structure allows a die to be tested with performance criteria consistent with "Known Good Die" testing and thus allowing performance level testing close to die to die interconnects in multi-die packages.

Figure 11:
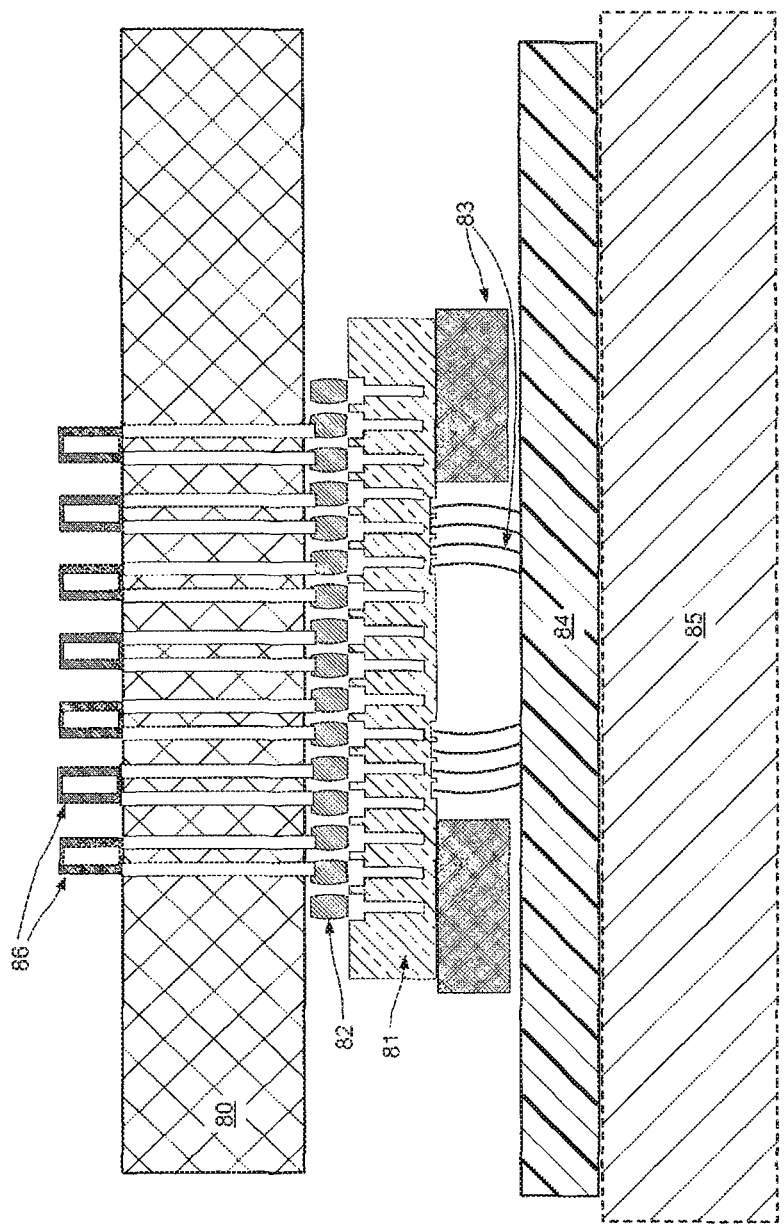
FIG. 11 is a sectional view of a prior art structure.

Another advantage of the novel structure of the embodiment of FIG. 1 is that substrate 12 is a wear item and is replaceable while the prior art substrate of FIG. 11 is not replaceable. FIG. 2 is the same embodiment of FIG. 1 in fully assembled form.

FIG. 3 is similar to the embodiment of FIGS. 1 and 2 except that the pitch translation substrate 12 is soldered to the passive component interposer 9. The entire circuitry is soldered together. The embodiment of FIG. 3 is more economical as it is there is no need to add in any complaint interconnects.

FIG. 4 is a similar embodiment to that of FIG. 3 except in FIG. 3 the circuit structure can be removed from the probe card and replaced. In FIG. 4 embodiment the entire circuit structure is soldered to the probe card 21. This makes this embodiment more reliable.

A second basic embodiment of the present invention is illustrated in FIGS. 5-7. Two minor deviations using sectional views of the improved method for signal loading and power supply deliver ring the second major embodiment: a glass or silicon based pitch translator substrate (PTS), based on a "TSV", "TGV", or like technology passive components mounted directly onto the pitch translator. The components may be in either a die or packaged form. A stiffening element with electrical conductivity paths permanently attached to the pitch translator substrate for mechanical strengthening, better durability, and coarse pitch translation, as required. FIG. 5 describes the individual component pieces. FIG. 6 shows FIG. 5 assembled in "mission mode". FIG. 7 describe a minor deviation, where by the compliant interconnect has been replaced by a more permanent connection of any form but commonly solder and copper pillar.

In FIG. 5 labels 34-38, 46 describe necessary functional items associated with the present invention but specifically included in the disclosure. These items are shown because they are necessary to describe both function and improvements over prior art.

FIG. 5 shows a partially exploded sectional view of a second embodiment of the present invention of a structure for decoupling passive components 41 such as capacitors 41 to directly attach on top the upper surface pitch translation substrate 44 this eliminates the need for an interposer as used in the embodiment of FIGS. 1-4 of the present invention. The passive components can be attached to the top of the pitch translation substrate 44 by one of two methods. The first method is by soldering the components to the top of the substrate. The second is by thermal sonic bonding which is a known technique in the art. And which heats up capacitors so that it spot welds to the top of the substrate. The dimensional thickness for the substrate is the same as for this embodiment as for the first embodiment of FIGS. 1-4 of the present invention.

FIG. 6 is the same embodiment as shown on FIG. 5 except it is a fully assembled view of the second embodiment of the present invention.

FIG. 7 is the similar to the embodiment from FIGS. 5 and 6 except the structure is all soldered together as one package to provide for better reliability.

FIGS. 8-10 basically describe a third embodiment of the present invention in which the passive components [65] are embedded directly into the pitch translation substrate [66]. This requires that the pitch translation substrate [65] be compatible with component embedding and that thin redistribution layers be built-up between the components and the lower/bottom surface of the pitch translation substrate [65]. Using thin layers (sub-5 um) creates the closest possible location of the passive embedded components [65] to the wafer/die [59]. Unlike the first and second embodiments of the present invention this third embodiment does not use a thin pitch translation substrate—only thin build-up layers, as shown in FIG. 20. Third embodiment also requires the routing method shown in FIG. 17 where the center portion (directly above the die) of the pitch translation substrate prioritizes on power and ground routing. Third embodiment has all of the distance gains of second embodiment plus, on average, 125 um to account for the effective thickness of the pitch translation substrate.

As shown in FIG. 12A, this third embodiment achieves the lowest possible supply loop impedance from the die to the passive components—outperforming both the first and second embodiments of the present invention and all prior art. FIGS. 13A, 14A, and 15A compare the data eye of the third embodiment to the prior art for a random data stream—667 MBs, 1000 MBs, and 2000 MBs, respectively. FIG. 16A compares dock data for the third embodiment to the prior art.

All embodiments embed the passive decoupling and filtering components in as way as to locate them much closer to the die itself. The first and second embodiments achieve this via embedding and with the use of a thin pitch translation substrate. The third embodiment achieves this via embedding within the pitch translation substrate, while using thin, very dense redistribution layers. In all cases, the embodiments reduce the supply loop impedance significantly—at minimum by a factor of 5 (first embodiment) and up to a factor of 20 (third embodiment) (See FIG. 12).

FIG. 8 shows a sectional exploded view of a third embodiment in which a structure has passive components 65 fully embedded directly to a pitch translation substrate 66, formed of thin build-up layers, as shown in FIG. 20, directly beneath thin electrical signal redistribution layers, the pitch translation substrate again has preferably the same width dimensions described in the pitch translation substrate of the first embodiment of FIG. 1 of the present invention. This third embodiment of the present invention shown in FIG. 8 provides the highest performance as the passive components 65 such as capacitors are embedded directly into the pitch translation substrate 66. FIG. 9 shows the embodiment of FIG. 8 in a fully assembled view FIG. 10 is similar to FIG. 8 embodiment all soldered together as one unit. FIG. 11 is the prior art structure previously discussed.

While presently preferred embodiments have been described for purposes of the disclosure, numerous changes in the arrangement of method steps and those skilled in the art can make apparatus parts. Such changes are encompassed within the spirit of the invention as defined by the appended claims.

What is claimed:

1. An Improved Power Supply Transient Performance (power integrity) structure for a Probe Card Assembly in an Integrated Circuit Test Environment, comprising:
   a thin pitch translator substrate; passive components are located within an interposer that also acts as an attach mechanism between the pitch translation substrate and the probe card so that the passive components are in close proximity to said pitch translation substrate so that low impedance to a high frequency permits a die to operate at package-level speed, thereby reducing yield loss at a packaging level.

2. The structure according to claim 1 where said passive components are capacitors.

3. The structure according to claim 1 wherein said pitch translation substrate is a glass or silicon based pitch translator substrate, based on a "TSV", "TGV" or like technology.

4. The structure according to claim 1 wherein said thin substrate 1 is 50 to 100 micrometer thick.

5. The structure according to claim 1 wherein said passive elements on the interposer are close to the probe card and are approximately 200-300 micro meters distance from the probe card.

6. The structure according to claim 1 wherein said pitch translation substrate is replaceable.

7. The structure according to claim 1 wherein said pitch translation substrate is soldered to said passive component interposer.

8. The structure according to claim 1 wherein said entire structure is soldered to the probe card thereby enhancing reliability of said structure.

9. The structure according to claim 1 wherein said passive electrical components, such as discrete capacitors, may be placed significantly closer to a die under test through a method of embedding and thus shortening the physical distance between the passive components and a die under test.

10. The structure according to claim 1, wherein said structure improves power supply filtering and decoupling, such that the die under test may operate at faster speeds, including package—level speeds.

11. The structure according to claim 1 wherein said substrate is an extremely thin pitch translation substrate connected to said passive decoupling components and reduces electrical length/delay in the supply path.

12. The structure according to claim 1 wherein a fan-out routing of the signals extends to a periphery of the pitch translation substrate for the purposes of prioritizing on power and ground routing directly above the die.

13. The structure according to claim 12 wherein a supply loop impedance is reduced, such that the die may operate at faster speeds, including package-level speeds.

14. The structure according to claim 1 wherein said structure allows a die to be tested with performance criteria consistent with "Known Good Die" testing and thus allowing performance level testing close to die to die interconnects in multi-die packages.

15. The structure according to claim 1 wherein wear items in a probe test environment can be interchanged rapidly, with minimal cost, and with no impact on embedded components.

16. The structure according to claim 1 wherein said passive components are attached to the top of the pitch translation substrate by soldering with solder and copper pillars said passive components to the top of the substrate.

17. The structure according to claim 1 wherein said passive components are attached to the top of the pitch translation substrate by thermal sonic bonding.

18. The structure according to claim 1 wherein said entire structure is soldered to the probe card thereby enhancing reliability of said structure.

* * * * *